Aug. 27, 1968 C. M. HENDERSON ET AL 3,399,082

GRAPHITE CONTAINING COMPOSITION AND THERMOELECTRIC GENERATOR

Filed Oct. 11, 1963

INVENTORS
COURTLAND M. HENDERSON
HEINZ B. JANKOWSKY
BY Mary B. Moshier
ATTORNEY

United States Patent Office 3,399,082
Patented Aug. 27, 1968

3,399,082
GRAPHITE CONTAINING COMPOSITION AND THERMOELECTRIC GENERATOR

Courtland M. Henderson, Xenia, and Heinz B. Jankowsky, Dayton, Ohio, assignors to Monsanto Research Corporation, St. Louis, Mo., a corporation of Delaware Filed Oct. 11, 1963, Ser. No. 315,596
19 Claims. (Cl. 136—203)

ABSTRACT OF THE DISCLOSURE

A coating composition having heat-emissive properties and comprising a mixture of graphite particles in a film-forming vehicle, said particles being diversely dimensioned platelets having a diameter of from 10 to 300 microns, with 80% by weight of said particles having a diameter of between about 43 microns and about 250 microns and 40% by weight of the particles having a diameter of about 70 to about 150 microns. The composition is particularly useful as a coating for metal radiators of thermoelectric devices. Examples of the film-forming vehicle are the polysiloxanes and phenol-formaldehyde varnish.

Figure 1:
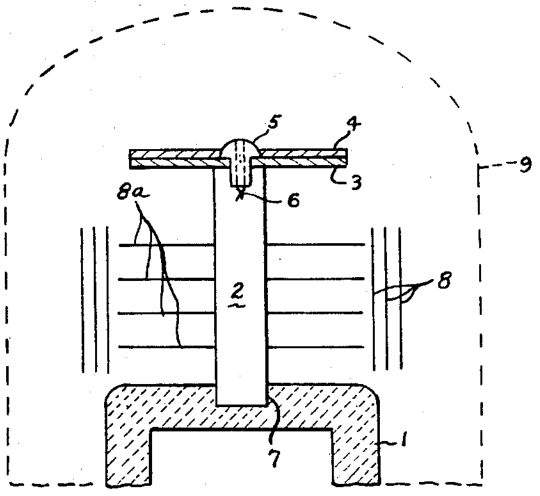

This invention relates to power generating devices and the like and more particularly relates to means of effecting heat transfer in thermoelectric generators and cooling devices, particularly in a space environment. More specifically, the invention provides new coating compositions having heat absorbing and emitting properties and thermoelectric, thermionic or fuel cell power-generating devices in which the new compositions are used.

In accordance with the Seebeck effect, electromotive force is produced when one thermoelectric element is joined to a dissimilar thermoelectric element to form a circuit and their two junctions are maintained at different temperatures. This effect is utilized in thermoelectric generators, whereby electrical power is generated when heat is applied at one junction and rejected at the other.

For environmental cooling, rather than generation of electricity, there is utilized the Peltier effect wherein the above described circuit of dissimilar thermoelectric materials is also used. However instead of applying heat at one junction and rejecting it at another, an electrical current is passed through the circuit causing a greater amount of cooling at one junction than the other. A transfer of heat from the ambient environment and through the device is thus effected, resulting in refrigeration.

In thermoelectric generators and other devices which are dependent on either the Seebeck effect or the Peltier effect one junction must be maintained at a temperature which is higher than that of another; hence, the two junctions are commonly referred to as either the hot junction or the cold junction. Whether the device be based on the Seebeck or Peltier effect, its efficiency depends not only upon the nature of the thermoelement which is employed, but also upon the temperature difference of the two junctions. The greater such difference, the greater is the efficiency of either the electrical power generation or cooling device, irrespective of the composition of the thermoelements.

Much effort has been expended at preparing thermoelectric materials having a high Seebeck coefficient, low electrical resistance and thermal conductivity in order to thus attain the highest possible figure of merit, and thereby there have been provided for this purpose many new semiconducting materials. Some of them withstand very high temperatures, i.e., they are neither broken down nor oxidized when heated to temperatures of, say, 800° C. to 2000° C. As the temperature is increased at the hot junction there is a proportionate increase in the quantity of energy withdrawn from the thermoelements, so long as the temperature at their cold junctions is held constant. In order to obtain maximum efficiency, the Carnot efficiency factor $$\frac{T_2-T_1}{T_2}$$

where $T_2$ is the hot junction absolute temperature and $T_1$ is the cold junction absolute temperature, should be as high as possible. A practical limitation is the maximum temperature at which the hot junction can operate satisfactorily. The hot end temperature limits the temperature that can be utilized at the cold junction—the radiator or heat rejection portion of generators to be used in space. Rejection of heat by thermal radiation is the chief means by which waste heat can be disposed of in a space environment. Thus to obtain high power output by thermoelectric, thermionic, fuel cell or other power-generating means in space, in accordance with the Stefan-Boltzmann equation, the quantity of heat rejected from a radiator varies directly with its surface emissivity and with the fourth power of the temperature of the radiating surface. The hotter the radiator, and the higher its emissivity the greater is the quantity of heat that is emitted from the surface thereof. Frequently, a major limiting factor, on generators to be used in space, is the weight and size of the radiator. Thus, there has been an urgent need to develop a radiator coating that would exhibit high surface emissivities at high (400° C.–1000° C.) temperatures in the vacuum of space.

The weight of a generator, including its radiator, is so major a factor in a space mission that thermal efficiency is frequently sacrified in favor of attaining a generator design of maximum power output per unit of generator weight.

An object of the present invention is the provision of an improved means of rejecting waste heat in a power-generating device in a vacuum or space environment. Another object is the provision of power-generating apparatus such as thermoelectric or thermionic generators or fuel cells comprising an improved means of rejecting waste heat to a vacuum or space environment. Still another object of the invention is the provision of a power-generating device having an improved radiator component. Still a further object of the invention is the provision of a thermoelectric generator wherein waste heat is absorbed and emitted to the atmosphere by means of an improved thermal radiator. A most important object is the provision of a coating composition which when applied to the thermal radiator improves the effectiveness thereof.

Figure 2:
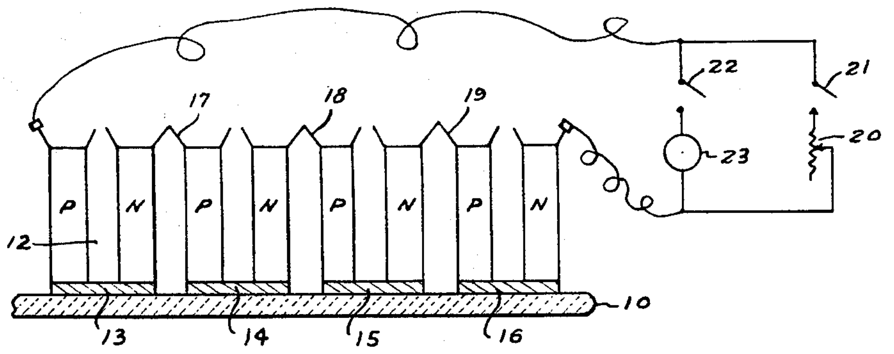

In the drawings:

FIGURE 1 is a sectional view of a thermoelectric generator embodying our invention; and FIGURE 2 is a sectional view of a modified thermoelectric generator.

In accordance with the present invention there is provided a coating composition comprising a mixture of graphite particles in a film-forming vehicle, wherein the graphite particles have a diameter of from 10 microns to 300 microns with at least 80 percent by weight of the particles having a diameter of between about 43 and about 250 microns and at least 40% by weight of particles having a diameter of 70 to 150 microns, and said coating composition is applied to the radiator of a power-generating device and dried. There is thus provided, in a thermoelectric device, a radiator means comprising a sheet of thermally conducting metal having a rough, pitted surface formed from applying said composition to the metal and drying or curing.

The metal sheet may or may not be finned, corrugated or cupped, the shape and size of the radiator being adjusted to the quantity of heat which is to be rejected as provided by laws pertaining to thermal radiation and as permitted by the allowable power-to-weight ratio of the device. Generally, the metal will be of aluminum, copper, gold, silver, beryllium, titanium, nickel or iron or of another highly conducting metal or alloy, e.g., dispersion-strengthened nickel or copper which can be fabricated into suitably rigid sheets.

The composition with which the radiator is coated remarkably improves the heat emitting property of the surface of the thermally conducting metal. While blacks, e.g., carbon black, lampblack, black oxides of metals, etc. are known to possess similar characteristics, the present coating is uniquely effective. This is ascribed not only to the pitted, irregular surface characteristic of the coating, but also to the particular sizing of the particles of graphite used. For example, coatings based on non-uniform random sized particles of, say, the black metal oxides (e.g., the black nickel, copper or cobalt oxides), normally considered to provide useful emitting surfaces, are not so effective as are the coating composition of this application.

The presently useful graphite is a non-amorphous graphite and is commercially available, but in a very wide and random range of particle sizes. The required fractions of the desired particle sizes specified in this application can be obtained from commercial powdered graphite by standard sieving procedures.

Coatings obtained with substantially very small and uniform particles of graphite, even in the presence of a minimum amount of bonding agent, impart a substantially smooth, rather than the presently desired, roughened and pitted surface and thereby the emissive property of the radiator coated with such smooth surfaces is not significantly increased. Of the commercial graphite, the following is especially useful for the composition of this application: 99.8% by weight through 60 Tyler mesh, 47.3% by weight through 200 Tyler mesh, and 16.5% by weight through 325 Tyler mesh. However, mixtures of particulated graphite having widely varying proportions of diversely dimensioned platelets are generally useful so long as the 10 to 300 micron overall range and the 43 to 250 micron range for the 80% content and the 70 to 150 micron range for the 40% content are observed.

The film-forming, substantially water-free vehicle in which the graphite is dispersed is a natural or synthetic oil or polymer. Preferably, the film-forming vehicle is one which is not adversely affected by the environment to which the radiator is exposed. The temperature to which the radiator is exposed is thus a major factor in selecting the vehicle, but when operating in vacuum, numerous natural and synthetic oils or resinous materials are known which serve the purpose, i.e., they serve to bind the particulated graphite, adhere to the surface of the thermally conductive metal, and are unaffected by the environmental conditions of use, e.g., there may be used shellac, drying oils such as linseed, soya bean or tung oil, vinyl resins, polysiloxanes, phenolic resins, urea-aldehyde resins, alkyd resins, etc. When resinous materials are used, they may be employed in solution, or in incompletely polymerized, liquid form, whereby subsequent hardening or curing is effected upon drying with or without application of heat. The art is well aware of the heat-resistant properties of numerous resinous materials as well as their ability to form adherent coating films on such thermally conducting, economically useful metals as copper and aluminum. Very frequently, even though a resinous coating becomes discolored and even appears to char as a result of exposure to very high temperatures, insofar as continuity of the film, adherence to the substrate and bonding of the filler are concerned, there is no adverse effect and the discoloration and charring does not decrease emissivity.

Graphite in crystalline or platelet form is readily bonded by resinous materials, generally. Hence, choice of vehicle will present no problem to those skilled in the art. Included among the resinous materials which may be used for the present purpose can be specifically mentioned the alkyd resin which is obtained from glycerol and phthalic or maleic anhydride or acid, the epoxy resin which is prepared by reacting bisphenol-A-with epichlorohydrin, phenol-formaldehyde resin, phenol-urea resin, vinyl chloride-vinyl acetate copolymer, cellulose acetate, melamine-formaldehyde resin, polyisobutylene, polystyrene, tetrafluoroethylene polymers, polyethylene terephthalate, polymeric butyl acrylate, polydimethylsiloxane, etc. When a resin is used, it may be generally incorporated into a drying oil and/or a volatile solvent such as alcohol, benzene or acetone, and the resulting mixture applied to the metal to be coated by conventional techniques, e.g., by brushing or spraying. Mixing of the graphite particles with a prepared varnish, i.e., a solution of a drying oil or resin in a volatile solvent is a simple means of preparing the present coatings. Phenolic or polysiloxane varnishes are especially useful. Depending upon the nature of the vehicle, the coating is then allowed to dry at room temperature or baked. In some instances there may be used a melt of the resin in which the graphite is dispersed; or there may be employed the polymerizable monomer or mixture of monomers or an incompletely polymerized resin with which the graphite is mixed prior to polymerization or completion of the polymerization. Such procedure is generally employed with the epoxy and polyester materials. Condensation resins, e.g., the phenol-aldehyde resins, may be similarly used, the liquid coating which is applied being a dispersion of the graphite in an intermediately formed condensate such as a Novolak, and hardening being brought about by adding hexamethylenetetramine and subsequently curing of the resin in situ, e.g., by heating the coated metal. For the preparation of highly heat-resistant coatings, use of such intermediately polymerized or condensed products for the liquid coating and hardening by completion of the polymerization or condensation reaction after brushing or spraying on the metal may be generally used, since resins which possess high thermal stability may lack proper solubility in oils or volatile solvents.

A dispersing agent may or may not be employed in preparing the liquid coating. The graphite may be dispersed simply by milling the particles into the resinous solution or into an intermediately formed low polymer. Suitable dispersing agents are, e.g., the long chain alkyl sulfosuccinates, the alkylbenzenesulfonates, the polyalkyleneglycols, etc. Whether or not dispersing agent is present, the substantial absence of water is advantageous, since the presence of water may interfere with the setting up of the desired rough, pitted surface. Very often, the solute resin or partially polymerized resin or monomer serves as suspending or dispersing agent. Also, as will be apparent to those skilled in the coating art, there may be incorporated, into the resin solution or melt, plasticizers, antioxidants or other adjuvants conventionally present in coatings.

The proportion of graphite to resin may be widely varied; however, since efficiency of the heat-rejecting properties of the coated metal will depend upon the total surface area of graphite which is to be presented to the environment, it is advantageous to use the maximum which can be incorporated into the vehicle without impeding easy application of the coating or with bonding of the quantity of graphite to the metal by the film-forming vehicle. Since the resin or other vehicle per se does not appear to contribute to the heat-transfer efficiency of the coating, the ratio of vehicle to graphite is thus advantageously kept at the minimum required for flow and adherence to metal.

Although the metal may first be coated with the resin solution or melt and the graphite particles subsequently sprinkled unto the surface of the coating before it hardens, in practice, a surface presenting non-uniform particles has been found to be more readily obtained by dispersing the graphite into the liquid composition before it is applied to the metal. Only a thin coating of the graphite-containing composition is needed to prepare a surface which, by microscopic examination, shows peaks and valleys resulting from the juxtaposition of large particles and small ones. When the coating is to emit, the deep valleys are hotter than the peaks and act as black bodies exhibiting nearly perfect emission. High concentrations of electrons are reacted at the tips of the very sharp peaks, with the result that electrons are more readily ejected into space, or in a vacuum. Thus, the presently provided, coated radiator emits much more energy at substantially lower surface temperature than does a radiator of the same uncoated metal or of a metal which has been coated with previously known coatings.

The invention is further illustrated by, but not limited to, the following examples:

Example 1

In order to compare, under simulated space conditions, the emissivities of the present coatings with those of the prior art, a series of tests was conducted using the apparatus shown in FIGURE 1. This apparatus was operated in a vacuum to eliminate the effect of convection cooling on test results. It consisted essentially of a uniformly heated graphite base 1 and a segmented, semi-conductor thermoelement rod 2, through which heat was conducted to a copper radiator 3, fixed to rod 2 by means of metallic screw 5 to insure good thermal contact between rod 2 and radiator 3. The various coatings to be compared were applied to radiator 3 to produce the thin emissive layer 4.

In practice, heat enters through base 1, and flows longitudinally through rod 2 and into radiator 3. Thermal energy was transferred by conduction from radiator 3 through layer 4 to the surface thereof where it was then radiated to the ambient space environment within the transparent walled vacuum chamber 9. Thermal radiation shields 8 and 8*a* were used to minimize the amount of heat that would otherwise be transferred from the heated base 1 and rod 2 to the sides of chamber 9.

The relative emissivity of the coatings was determined by noting the temperature difference that was developed in each test between the point at which thermocouple 6 was positioned and the point at which thermocouple 7 was positioned, after the temperature at 7 had reached an equilibrium or a constant value. The greater the temperature difference that developed, the greater was the emissivity of the coating. The relative emissivity of the graphite base composition of this invention was compared with the emissivities of an uncoated radiator and of three prior art coatings. Only the radiator was changed in conducting the tests, and in each case the radiator was made of the same copper sheeting of the same dimension to which the same volume of coating was uniformly applied. The results of these tests are shown below:

| | Radiator coating | Hot end, °C. | Cold end, °C. | ΔT., °C. |
|---|---|---|---|---|
| 1 | No coating | 795.0 | 644.5 | 150.5 |
| | | 999.5 | 756.5 | 243.0 |
| | | 1,200.0 | 868.8 | 331.2 |
| 2 | "Rustoleum" black stove paint. | 815.0 | 646.8 | 168.2 |
| | | 985.0 | 730.6 | 254.4 |
| | | 1,207.5 | 827.0 | 380.5 |
| 3 | A dispersion of powdered Al in toluene. | 825.8 | 647.5 | 178.3 |
| | | 980.0 | 733.5 | 246.5 |
| | | 1,212.5 | 855.5 | 357.0 |
| 4 | "Oildag" and oxidized over Bunsen burner. | 794.0 | 650.3 | 143.7 |
| | | 982.5 | 753.2 | 229.3 |
| | | 1,203.0 | 857.5 | 345.5 |
| 5 | A dispersion of 3 g. of a graphite mixture in 2.1 g. ethanol and 3 g. of phenolic varnish SC-1008. | 795.0 | 545.6 | 249.4 |
| | | 971.3 | 624.8 | 346.5 |
| | | 995.0 | 652.0 | 343.0 |
| | | 1,190.0 | 760.8 | 429.3 |

"Rustoleum" black stove paint, used in Test 2, is a graphitic protective coating which dries to a smooth, black film.

Oildag, used in Test 4, is a concentrated dispersion of substantially uniform, microscopic particles of graphite in a petroleum-base vehicle.

The varnish which was used in Test 5 was phenolic laminating varnish Resinox SC-1008, which is a mixture of a phenol-formaldehyde resin and a drying oil, having a solid content of 60–64%, a viscosity of 180–300 cps., a pH of 7.9–8.5, and a specific gravity of 1.080–1.100. The coating of Test 5 dried to give a rough surface.

The graphite mixture used in Test 5 was characterized as follows:

| Tyler mesh | Diameter, micron | Passing, wt. percent |
|---|---|---|
| 60 | 250 | 99.8 |
| 80 | 177 | 96.8 |
| 100 | 149 | 86.0 |
| 200 | 74 | 47.3 |
| 325 | 44 | 16.5 |

From the above table it can be seen that about (a) 100% by weight of the graphite particles pass the 60 Tyler mesh of about 250 microns; about (b) 47% by weight of the particles pass the 200 Tyler mesh of about 74 microns, and about (c) 16% by weight of the particles pass the 325 Tyler mesh of about 44 microns.

It also follows from the above that the fraction of commercial graphite sieved between (1) 60 mesh and 200 mesh contains about 53% (100%–47%) by weight particles distributed in size between about 250 microns to about 74 microns; the fraction sieved between (2) 200 mesh and 325 mesh contains about 31% (47%–16%) by weight particles distributed in size between about 74 microns to about 44 microns, and the fraction sieved with 325 mesh contains about (3) 16% by weight of particles distributed in size and less than about 44 microns.

The above tests show that use of the graphitic coating of Test 5 was far superior, with respect to temperature difference, and therefore surface emissivity to either the uncoated radiator or to radiators having the other coatings.

Example 2

A coating was prepared by dispersing into silicone oil a mixture of particulated graphite having substantially no particles larger than 50 Tyler mesh and smaller than 325 Tyler mesh. The silicone oil which was used was Dow-Corning 806–A which is a polymeric alkyl aryl siloxane dissolved in a mixture of xylene and toluene to give a solution having a specific gravity of 1.03 and a specific viscosity at 25° C. of from 100–200 centipoises. The concentration of the graphite mixture in the coating was 60% by weight, and it was just thin enough to permit application of the coating by brush. The coating was applied to one surface of a copper disc having an area of one square inch, and baked to dryness in an oven at 150° C. A rough surface having peaks and deep valleys was obtained.

One surface of another copper disc, cut from the same copper sheet and having the same dimensions, was coated by flame-spraying with nickel oxide, a high temperature coating of recognized emissivity.

The coated discs were used as radiators in the apparatus shown in FIGURE 1. A graphite rod, 1.5" long and 0.5" in diameter, served as thermoelement rod 2; otherwise, the same construction as that described in Example 1 was used. Rod 2 was inserted into the resistance-heated, graphite base 1; and radiator 3, comprising one of the above described coated discs, was fixed at the opposite end of the rod by means of screw 5. Thermocouple 7 was positioned at the hot end of the rod and thermocouple 6 at the cold end of the rod. Readings obtained at the points where thermocouples 6 and 7 were positioned at 30-minute intervals, while operating in vacuum during a two hour period, were as follows:

| Graphitic Coating | | | Nickel Oxide Coating | | |
|---|---|---|---|---|---|
| Hot end, °C. | Cold end, °C. | ΔT., °C. | Hot end, °C. | Cold end, °C. | ΔT., °C. |
| 1,000 | 550 | 450 | 1,000 | 565 | 435 |
| 1,000 | 549 | 451 | 1,000 | 565 | 435 |
| 1,010 | 553 | 447 | 1,010 | 566 | 434 |
| 1,005 | 551 | 449 | 1,005 | 565 | 435 |
| 1,000 | 550 | 450 | 1,000 | 564 | 436 |

The above data show a significant difference in the effect of the two coatings on the heat rejecting capabilities of the radiator. The graphitic coating of this invention, as shown by the higher temperature difference (ΔT) obtained with it, as compared with the nickel oxide coating, emitted more energy from its surface and thus exhibited a higher surface emissivity.

The significance of the effect of emissivity to temperature control and power generating systems in space vehicles may be more evident when it is realized that the larger (14–15° C.) temperature difference attained with the presently provided coating would permit the production of 3–4% more power in a power generator than is possible with the nickel oxide coating.

Example 3

A sustained performance test, over a 282 hour period, was conducted to determine the effect of high temperature and extended operation on the performance of the presently provided coatings. The apparatus shown in FIGURE 1 and described in Example 1 was used, except that a cylindrical graphite rod was employed as thermoelement rod 2.

In conducting this test, there was employed the graphitic-phenolic varnish coating used in Test 5 of Example 1. It was applied as a thin coat to a copper sheet which was 0.010" thick, 0.5" wide and 1.0" long, and the coated sheet was used as radiator 3. The apparatus was placed in vacuum chamber 9, where after evacuation of the chamber, heat was applied through base 1 until thermocouple 7 reached about 1200° C. The temperature at 7 was maintained between 1203° C. and 1208° C., and the vacuum held at from $10^{-5}$ to $10^{-6}$ mm. of Hg pressure for 282 hours. Under these conditions the following results were obtained.

| Hours of operation | Av. hot end temp., ° C. | Av. cold end temp., ° C. | Av. ΔT, ° C. |
|---|---|---|---|
| 1 | 1,200 | 459 | 741 |
| 17 | 1,203 | 459 | 744 |
| 41 | 1,202 | 461 | 741 |
| 68 | 1,210 | 461 | 749 |
| 94 | 1,193 | 459 | 734 |
| 113 | 1,196 | 458 | 738 |
| 137 | 1,206 | 461 | 745 |
| 160 | 1,206 | 461 | 745 |
| 185 | 1,207 | 462 | 745 |
| 211 | 1,207 | 463 | 744 |
| 235 | 1,205 | 464 | 741 |
| 266 | 1,207 | 464 | 743 |
| 282 | 1,208 | 464 | 744 |

Since ΔT values of substantially the same order prevailed during the entire 282 hour period, there was apparently no deterioration of the coating. In previous runs using the same apparatus, but with an identical radiator substrate coated with the black stove paint used in Test 2 of Example 1, the ΔT steadily decreased with time, until at the end of 150 hours, the ΔT was only 60% of its starting value. Clearly, the graphite composition of this invention remained stable and useful for substantially longer periods of use than did the black stove paint which, although graphitic, gave a smooth rather than pitted surface.

Example 4

The graphite-phenolic varnish coating of Test 5, Example 1, was subjected to measurement of total hemispheric emittance and absorptance, using the following procedure: Said coating was brushed on one surface of a 0.01" thick copper disc of ¾" diameter. The coated disc was then air-dried and heated in a vacuum oven for a few hours at a temperature of from 200° C. to 400° C. Three holes were drilled through the disc 120° apart around the edge thereof. Thermocouple wires were fastened into two of these holes and a third supporting wire in the third. The disc was then suspended by the three wires in a black walled, evacuated black body chamber. The thermocouple circuit used to measure the temperature of the disc was through the disc itself; hence, the output voltage, read on the recording potentiometer, indicated the actual temperature of the disc. All voltages read were referred to 0° C. with the cold junction immersed in a Dewar vessel containing melting ice. Heat was supplied by beam irradiance (cored carbon arc) measured with a radiometer whose output was measured on a recording potentiometer. The radiometer had a time constant of less than 1 second and was calibrated directly against a platinum-blackened specimen in the chamber. Two recorders were used, so that no electrical leads had to be changed during the tests. Absorptance was determined by the rate of temperature rise; and total hemispheric emittance was determined from the rate of temperature decay when radiation was removed. The following results for emittance $\epsilon$ and absorptance $\alpha$ were obtained at the temperatures shown below:

| Temp., ° C. | $\epsilon$ | P |
|---|---|---|
| 500 | 0.90 | 0.98 |
| 600 | 0.92 | 0.98 |
| 700 | 0.93 | 0.97 |
| 800 | 0.95 | ------------ |
| 900 | 0.98 | ------------ |

The high emittance values at the increased temperatures agree with the high ΔT values in tests of this same coating on the radiators of the devices of the preceding examples. That the coating possesses very good stability to heat is evident from the fact that there was no sign of deterioration as a consequence of the absorptance and emissivity measurements and from the fact that its ΔT's remained high over a long period in the performance test of Example 3 wherein the thermoelectric device comprised a similarly coated radiator.

Example 5

In another embodiment of the invention, p-type and n-type thermoelements are assembled to give either a power generator or a cooling device, as shown in FIGURE 2. Element 10 represents an electrical insulating but thermally conducting hot wall of a nuclear or chemical reactor, exhaust manifold, pipe or other unit which it is desirable to cool or from which heat can be absorbed for the purpose of converting to electricity. Element 12 represents an air or vacuum gap or electrically and thermally insulating material between each p-n thermoelement or leg. Elements 13, 14, 15 and 16 represent individual hot junctions straps between each p-n combination. Elements 17, 18 and 19 represent individual cold junctions between each n-p combination. Said junctions comprise a strap or sheet of electrically and thermally conducting metal, e.g., graphite or molybdenum at the hot ends, and copper or beryllium at the cold ends. These straps are fixed to each of the two members of the p-n combination by a thermally and electrically conductive adhesive or screw. The cold junctions are outwardly finned between each of the n-p combinations. That surface of the cold junction strap or sheet which is presented to the ambient had bonded to it an emissive coating which is a dispersion of non-uniform particles of graphite, having a diameter of within 10 to 300 microns,, with 80% being from 43 to 250 microns and 40% being 70 to 150 microns, in an epoxy resin formed by the condensation of 4,4'-isopropylidenediphenol and epichlorohydrin and subsequent curing with p-phenylenediamine. Elements 17, 18 and 19 serve both as electrical conductors and as radiators, heat being removed from said elements by radiation cooling. When the unit is to serve as energy converter, load 20 is connected through switch 21 with switch 22 open. To generate electricity, a heat source is directed at element 10, through which the heat flows to the individual hot junctions 13, 14, 15 and 16, then through each p and n leg and thence through cold junctions 17, 18 and 19. Thermal energy is converted to electricay energy when the thermal energy flows through the p and n legs of the device. This electrical energy can then be used to operate load 20.

When the unit is to be used as a cooling device, switch 21 is opened and switch 22 is closed, connecting the unit in series with a power source 23 which causes current to flow in a reverse direction to that of the flow when the unit produces electric power. By reversing the direction of current used for cooling, the unit will supply heat at the previously cool part of the device and cooling at the previously hot end of the device. Thus, the device can be used for heating or cooling, depending on the direction of current flow from power source 23.

Thermoelectric devices of the type shown in FIGURE 2 are particularly useful for generating power when such a device is installed as a part of the exhaust system of autos, planes, boats, rockets and other systems where waste heat in excess of, say, 400° C. is available.

When elements 17, 18 and 19 are coated with the highly emissive coating composition of this invention, the generator can be more effectively operated in a space environment where radiation is the principal means of rejecting unwanted energy from a vehicle.

In the design of thermoelectric devices, particularly for use in space where generators of minimum weight must be used, it is especially important to have available not only thermoelectric units capable of operation at high temperatures, but highly emissive coatings capable of long-lived operation in a vacuum at elevated temperatures. The availability of emissive coatings capable of meeting these requirements permit the design and fabrication of thermoelectric cooling and heating devices and power generating units with higher watt per pound ratios than is possible when conventional lower emissive and less stable coatings are used.

The coated radiators are also advantageously used with thermoelements in wafer form, particularly in the fabrication of solar cells wherein surface areas for collection of radiant energy are complemented by surface areas of emittance.

The presently provided coating compositions and radiators to which they have been applied are useful in thermoelectric devices generally, e.g., in power generators, cooling units, and in all devices, including thermionic units or diodes and fuel cells where a power generating assembly requires heat rejection or absorption. Hence, the above examples and accompanying drawings are intended by way of illustration only. It will be obvious to those skilled in the art that many variations are possible within the spirit of the invention, which is limited only by the appended claims.

What is claimed is:

1. A coating composition comprising a mixture of graphite particles in a film-forming vehicle, said graphite particles consisting essentially of;
 (1) about 53% by weight particles distributed in size between about 250 microns to about 74 microns,
 (2) about 31% by weight particles distributed in size between about 74 microns to about 44 microns, and
 (3) about 16% by weight particles distributed in size and less than about 44 microns,
 said composition providing in normal use in a thermoelectric device, a temperature differential of at least 343° C.

2. The composition defined in claim 1, further limited in that the film-forming vehicle is a polysiloxane.

3. The composition defined in claim 1, further limited in that the film-forming vehicle is a phenolic varnish.

4. The composition defined in claim 1, further limited in that the film-forming vehicle is a polymeric alkyl aryl siloxane.

5. The composition defined in claim 1, further limited in that the film-forming vehicle is a phenol-formaldehyde varnish.

6. In a power-generating device, a radiator means comprising a sheet of thermally conducting metal having upon the heat-emitting surface thereof an irregularly pitted coating formed by applying to said surface the composition defined in claim 1.

7. The radiator means defined in claim 6, further limited in that said metal is selected from the class consisting of aluminum, copper, gold, silver, beryllium, titanium, nickel and iron.

8. In a thermoelectric device, a radiator means comprising a sheet of thermally conducting metal having upon the heat-emitting surface thereof a rough, pitted coating formed by applying to said surface a coating composition comprising a mixture of graphite particles in a film-forming vehicle, said graphite particles consisting essentially of;
 (1) about 53% by weight particles distributed in size between about 250 microns to about 74 microns.
 (2) about 31% by weight particles distributed in size between about 74 microns to about 44 microns, and
 (3) about 16% by weight particles distributed in size and less than about 44 microns.

9. The radiator means defined in claim 8, further limited in that the film-forming vehicle is a polysiloxane.

10. The radiator means defined in claim 8, further limited in that the film-forming vehicle is a phenol-formaldehyde varnish.

11. The radiator means defined in claim 8, further limited in that the metal is selected from the class consisting of aluminum, copper, gold, silver, beryllium, titanium, nickel and iron.

12. A thermoelectric device comprising a thermoelement and a radiator comprising a sheet of a thermally conductive metal in thermal connection with the thermoelement, one surface of said sheet being disposed to receive heat resulting from operation of the device and the other surface of the sheet being in heat-transfer relationship with the surrounding ambient and being coated with a rough, pitted coating formed by applying to said other surface of the sheet a coating composition comprising a mixture of graphite particles in a film-forming vehicle, said graphite particles consisting essentially of;
 (1) about 53% by weight particles distributed in size between about 250 microns to about 74 microns,
 (2) about 31% by weight particles distributed in size between about 74 microns to about 44 microns, and
 (3) about 16% by weight particles distributed in size and less than about 44 microns.

13. The thermoelectric device of claim 12, further limited in that the metal is selected from the class consisting of aluminum, copper, gold, silver, beryllium, titanium, nickel and iron.

14. The thermoelectric device of claim 12, further limited in that the film-forming vehicle is a phenolic varnish.

15. The thermoelectric device of claim 12, further limited in that the film-forming vehicle is a polysiloxane.

16. A thermoelectric generator comprising a p-n couple of elongated thermoelements having hot thermojunction means at one end electrically joining said thermoelements and having cold thermojunction means at the other end of each said thermoelements, and radiator means in thermal contact with the cold thermojunction, said radiator means comprising a sheet of a thermally conducting metal, one surface of said sheet being disposed to receive heat resulting from operation of the generator and the other surface of said sheet being in heat-transfer relationship with the surrounding ambient and being coated with a rough, pitted coating comprising a mixture of graphite particles in a film-forming vehicle, said graphite particles consisting essentially of;
 (1) about 53% by weight particles distributed in size between about 250 microns to about 74 microns,
 (2) about 31% by weight particles distributed in size between about 74 microns to about 44 microns, and
 (3) about 16% by weight particles distributed in size and less than about 44 microns.

17. The generator defined in claim 16, further limited in that the metal is selected from the class consisting of aluminum, copper, gold, silver, beryllium, titanium, nickel and iron.

18. The generator of claim 16, further limited in that the film-forming vehicle is a phenol-formaldehyde varnish.

19. The generator of claim 16, further limited in that the film-forming vehicle is a polymeric alkyl aryl polysiloxane.

References Cited

UNITED STATES PATENTS

| | | | |
|---|---|---|---|
| 2,542,808 | 2/1951 | Gilmanetal. | 252—511 |
| 2,679,569 | 5/1954 | Hall | 117—226 |
| 2,730,597 | 1/1956 | Podolsky et al. | 117—226 X |
| 3,225,208 | 12/1965 | Wolfe | 136—206 X |

FOREIGN PATENTS

| | | |
|---|---|---|
| 869,761 | 6/1961 | Great Britain. |

OTHER REFERENCES

Gubareff et al., Thermal Radiation Properties Survey, 2nd edition, Honeywell Research Center, Minneapolis-Honeywell Regulator Co., Minneapolis, Minn. (Only pp. 55–57, 213, 219, 220, 225 and 226 relied upon.)

ALLEN B. CURTIS, *Primary Examiner.*